United States Patent
Suzumura et al.

(10) Patent No.: US 9,964,824 B2
(45) Date of Patent: May 8, 2018

(54) DISPLAY DEVICE

(71) Applicant: Japan Display Inc., Minato-ku (JP)

(72) Inventors: Isao Suzumura, Tokyo (JP); Arichika Ishida, Tokyo (JP); Norihiro Uemura, Tokyo (JP); Hidekazu Miyake, Tokyo (JP); Hiroto Miyake, Tokyo (JP); Yohei Yamaguchi, Tokyo (JP)

(73) Assignee: Japan Display Inc., Minato-ku (JP)

( * ) Notice: Subject to any disclaimer, the term of this patent is extended or adjusted under 35 U.S.C. 154(b) by 91 days.

(21) Appl. No.: 14/793,106

(22) Filed: Jul. 7, 2015

(65) Prior Publication Data
US 2016/0012782 A1    Jan. 14, 2016

(30) Foreign Application Priority Data

Jul. 14, 2014 (JP) ................................. 2014-144183

(51) Int. Cl.
*G09G 3/36* (2006.01)
*G02F 1/1368* (2006.01)
(Continued)

(52) U.S. Cl.
CPC ...... *G02F 1/1368* (2013.01); *G02F 1/133345* (2013.01); *G02F 1/136227* (2013.01); *H01L 27/1288* (2013.01)

(58) Field of Classification Search
CPC ........... G09G 3/3677; G09G 2320/043; G09G 2300/0819; H01L 29/42384;
(Continued)

(56) References Cited

U.S. PATENT DOCUMENTS

2010/0081222 A1* 4/2010 Kim .................. G02F 1/1368
438/30
2010/0244036 A1* 9/2010 Park .................. H01L 29/42384
257/72
(Continued)

FOREIGN PATENT DOCUMENTS

CN    1577025 A    2/2005
CN    1591146 A    3/2005
(Continued)

OTHER PUBLICATIONS

Office Action dated Aug. 18, 2017 in Chinese Patent Application No. 2015-10411619.1, w/English-language Translation.

*Primary Examiner* — Chad Dicke
*Assistant Examiner* — Robert Michaud
(74) *Attorney, Agent, or Firm* — Oblon, McClelland, Maier & Neustadt, L.L.P.

(57) ABSTRACT

According to one embodiment, a display device includes a TFT on an insulating substrate. The TFT includes a gate electrode, an insulating layer on the gate electrode, a semiconductor layer on the insulating layer, and a source electrode and a drain electrode each provided in contact with at least a part of the semiconductor layer. The source and drain electrodes have a laminated structure including a lower layer, an intermediate layer and an upper layer. The source and drain electrodes include sidewalls each including a first tapered portion on the upper layer side, a second tapered portion on the lower layer side and a sidewall protective film attached to the second tapered portion. The taper angle of the first tapered portion is smaller than that of the second tapered portion.

12 Claims, 5 Drawing Sheets

(51) Int. Cl.
*G02F 1/1333* (2006.01)
*G02F 1/1362* (2006.01)
*H01L 27/12* (2006.01)

(58) Field of Classification Search
CPC ......... H01L 29/66757; H01L 29/78618; H01L 27/1225; H01L 29/7869; G02F 1/1368; G02F 1/133345; G02F 1/136227
See application file for complete search history.

(56) References Cited

U.S. PATENT DOCUMENTS

2011/0266956 A1* 11/2011 Park .................. H01L 27/1248
 315/71
2012/0187396 A1* 7/2012 Yamazaki ......... H01L 29/66742
 257/43
2013/0214270 A1* 8/2013 Yamazaki ......... H01L 29/78618
 257/43

FOREIGN PATENT DOCUMENTS

| | | |
|---|---|---|
| JP | 07-111265 | 4/1995 |
| JP | 2000-232096 | 8/2000 |
| JP | 2013-4606 A | 1/2013 |
| WO | WO 2014/054428 A1 | 4/2014 |

* cited by examiner

DISPLAY DEVICE

CROSS-REFERENCE TO RELATED APPLICATIONS

This application is based upon and claims the benefit of priority from Japanese Patent Application No. 2014-144183, filed Jul. 14, 2014, the entire contents of which are incorporated herein by reference.

FIELD

Embodiments described herein relate generally to a display device.

BACKGROUND

In recent years, display devices employing thin-film transistors as a semiconductor device have been commercialized. Examples of such display devices are liquid crystal displays, organic electroluminescent displays and the like.

A display device of this type comprises an array substrate on which thin-film transistors, interconnecting traces such as signal lines, gate lines and source-drain electrodes, a passivation film and the like are formed. The thin-film transistors and various interconnecting traces are patterned into predetermined forms by such methods as photolithography and dry etching.

In the process of manufacturing a display device, if an array substrate for display device is formed on a large-sized substrate, the in-plane evenness of processing is degraded. For example, in the chamber where the etching is performed, the density of radical species or ionic species easily disperses from the central portion to a peripheral portion of the substrate if it is large because of the influence of exhaust gas or the like (that is, a difference in ratio [density distribution] is easily produced). Therefore, the forms of the interconnecting traces, electrodes and the like are likely to differ from the central portion of the large-sized substrate to the peripheral portion.

Moreover, if the substrate is large, it is hard to attract radicals and ions to the substrate side in the etching step because of its specification, and further re-deposition on the sidewall of a portion to be etched is not sufficient, making it easy to cause progression of side etching. That is, the taper angle of the etching surface tends to be small. Alternatively, the re-deposition tends to be uneven, and further the sidewalls tend to be rough. For these reasons, it is difficult to obtain a processed form as designed in etching.

DETAILED DESCRIPTION

Various embodiments will be described hereinafter with reference to the accompanying drawings. In general, according to one embodiment, a display device comprises a thin-film transistor comprising: a gate electrode; an insulating layer provided on the gate electrode; a semiconductor layer at least a part of which is provided to overlaid on the gate electrode; and a source electrode and a drain electrode provided in contact with at least a part of the semiconductor layer. Each of the source electrode and the drain electrode comprises a laminated structure including a lower layer located in the semiconductor layer side, an intermediate layer of aluminum as a main constituent and an upper layer. The source electrode and the drain electrode comprise sidewalls each comprising a first tapered portion on an upper layer side, a second tapered portion on a lower layer side and a sidewall protective film attached to the second tapered portion, and a taper angle of the first tapered portion being smaller than a taper angle of the second tapered portion.

Note that the disclosure is presented for the sake of exemplification, and any modification or variation conceived within the scope and spirit of the embodiments by a person having ordinary skill in the art is naturally encompassed in the scope of embodiment of the present application. Furthermore, the width, thickness, shape, and the like of each element are depicted schematically in the figures as compared to actual embodiments for the sake of simpler explanation and do not limit the interpretation of the present embodiments. Furthermore, in the description and figures of the present application, structural elements having the same or similar functions will be referred to by the same reference numbers and detailed explanations of them that are considered redundant may be omitted.

First Embodiment

Figure 1:
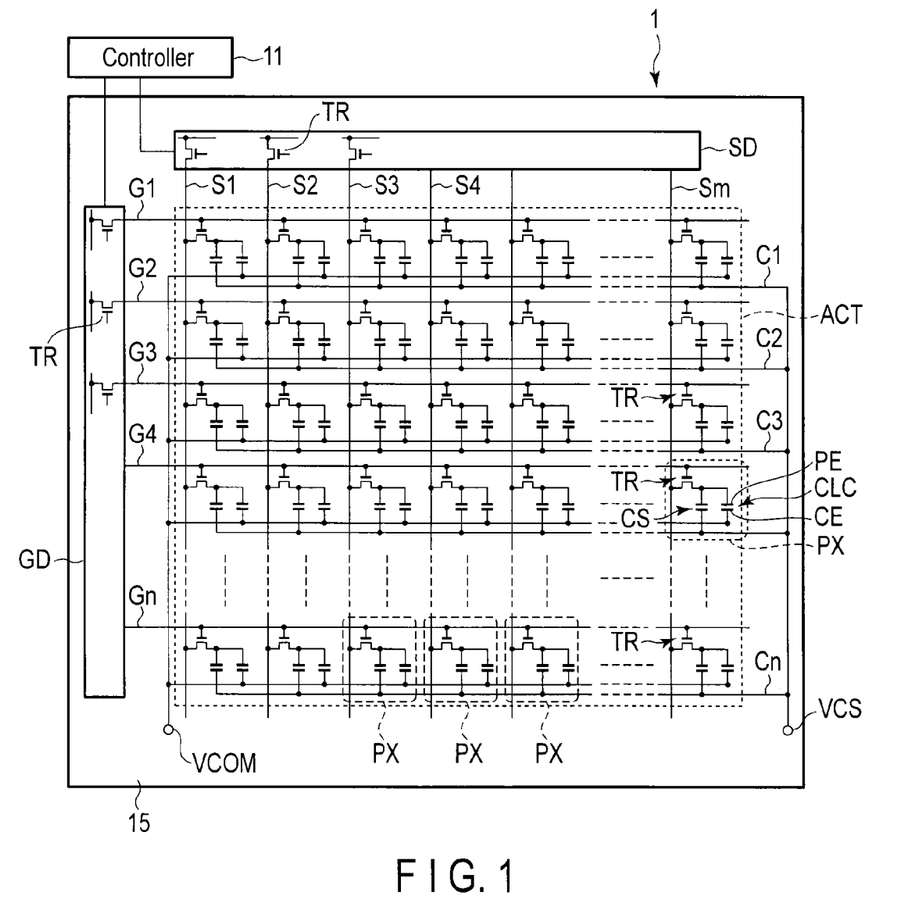
FIG. 1 is an exemplary diagram schematically showing the structure of a display device according to a first embodiment.

FIG. 1 is an exemplary plan view schematically showing a display device according to the first embodiment. Here, a liquid crystal display device will be described as an example of the display device comprising an array substrate. A liquid crystal display device 1 can be accommodated to be used in various types of electronic devices, for example, smartphones, tablets, mobile phones, notebook type computers, portable game consoles, electronic dictionaries or televisions.

As shown in FIG. 1, the liquid crystal display device 1 comprises an insulating substrate 15 in the form of, for example, a glass substrate with light transmitting property, a display section (active area) ACT provided on the insulating substrate 15 and configured to display images and driver circuits GD and SD configured to drive the display section ACT. The display section ACT comprises display pixels PX arranged in a matrix.

On the display section ACT, gate lines (G1-Gn), capacitance lines C (C1-Cn), source lines S (S1-Sm), power line VCS, etc., are formed. Each gate line G is drawn to an outer side from the display section ACT and is connected to the gate driver circuit GD. Each source line S is drawn to an outer side from the display section ACT and is connected to the source driver circuit SD. Each capacitance line C is electrically connected to the power line VCS to which an auxiliary capacitance voltage is applied.

The driver circuits GD and SD are integrated with the insulating substrate 15 on the outside of the display section ACT, and a controller 11 is connected to the driver circuits GD and SD.

Each display pixel PX comprises a liquid crystal capacitor CLC, a thin-film transistor (TFT) TR, a storage capacitor CS connected in parallel with the liquid crystal capacitor CLC, etc. The liquid crystal capacitor CLC comprises a pixel electrode PE connected to the thin-film transistor TR, a common electrode CE electrically connected to a common-potential application unit VCOM and a liquid crystal layer interposed between the pixel electrode PE and the common electrode CE.

The thin-film transistor TR is electrically connected to a respective gate line G and a respective source line S. To the gate line G, a control signal for on/off control of the thin-film transistor TR is supplied from the gate driver circuit GD. To the source line S, a video signal is supplied from the source driver circuit SD. When the thin-film transistor TR is on based on the control signal supplied to the gate line G, the transistor TR applies (writes) to the respective pixel electrode PE the pixel potential according to the video signal supplied to the source line S. The voltage applied to the liquid crystal layer is controlled by the potential difference between the common electrode CE at the common potential and the pixel electrode PE at the pixel potential.

The storage capacitor CS is configured to hold the voltage applied to the liquid crystal layer for a fixed period, and comprises a pair of electrodes opposing each other via an insulating layer. For example, the storage capacitor CS comprises a first electrode whose potential is the same as that of the pixel electrode, a portion of the capacitance line C or a second electrode electrically connected to the capacitance line C, and an insulating layer interposed between the first electrode and the second electrode.

Each of the gate driver circuit GD and the source driver circuit SD comprises thin-film transistors (TFTs) TR each functioning as a switching element.

Figure 2:
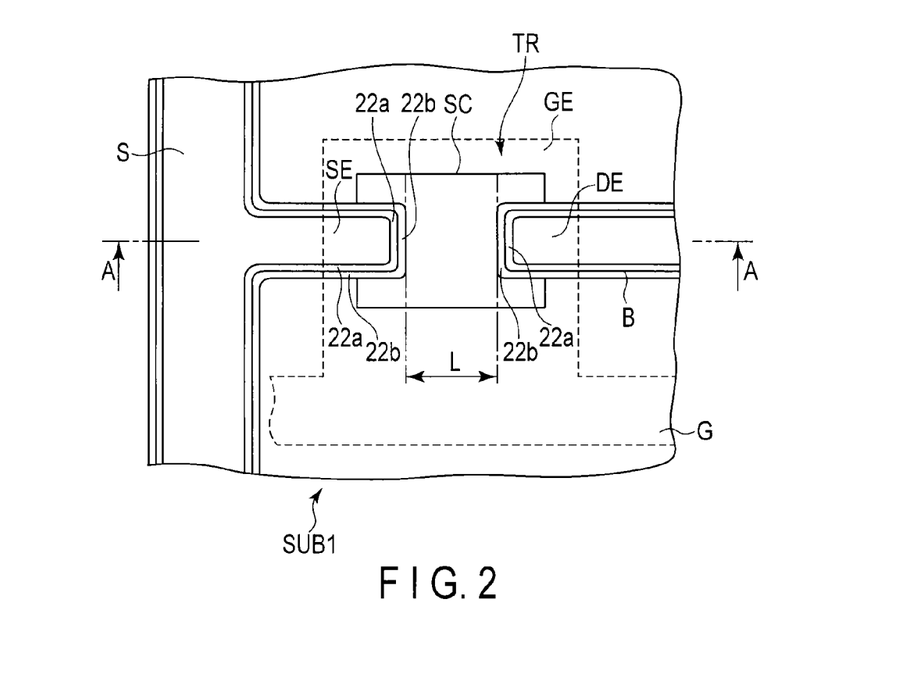
FIG. 2 is an exemplary plan view schematically showing the structure of an array substrate applied to the display device shown in FIG. 1.
Figure 3:
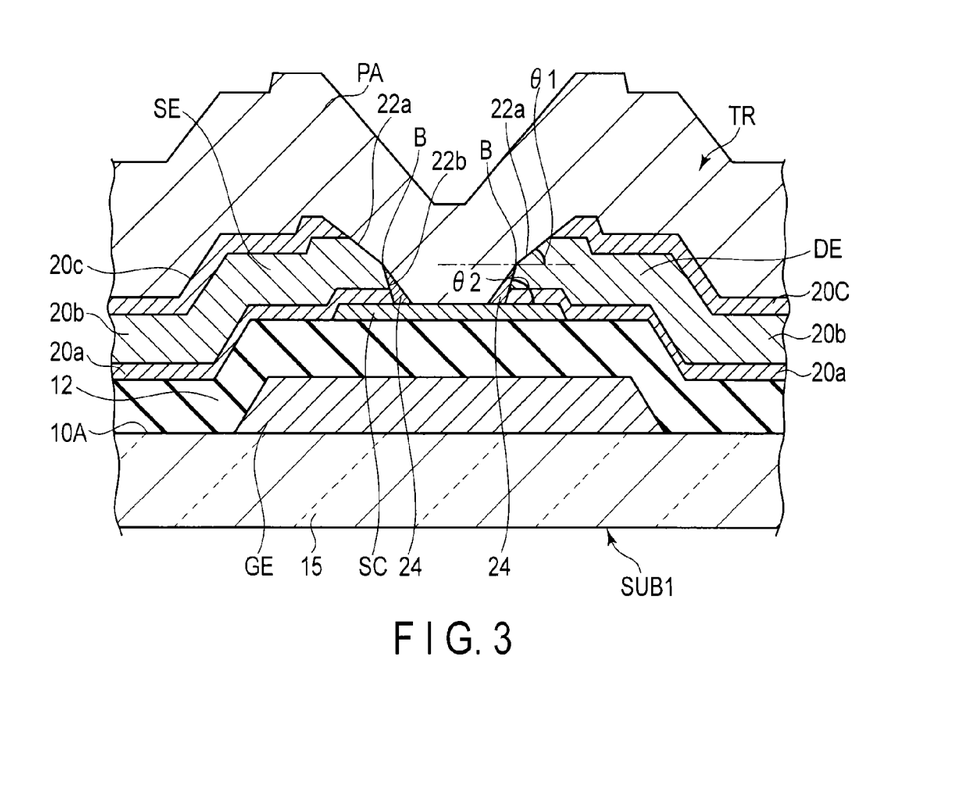
FIG. 3 is a sectional view of the array substrate, taken along line A-A in FIG. 2.

FIG. 2 is an exemplary plan view schematically showing the structure of an array substrate applicable to the liquid crystal display device 1 shown in FIG. 1, and FIG. 3 is a sectional view of the array substrate taken along line A-A of FIG. 2.

An array substrate SUB1 is formed of a light-transmissive insulating substrate 15, such as a glass or a resin substrate. The array substrate SUB1 comprises, on the insulating substrate 15, display pixels PX each comprising a thin-film transistor TR, a storage capacitor CS, gate lines G, source lines S and pixel electrodes, and also thin-film transistors TR which constitute the gate driver circuit GD and the source driver circuit SD. Here, the embodiment will be described in detail with reference to thin-film transistors TR, which may be considered typical semiconductor devices.

In the example of the structure shown in FIGS. 2 and 3, each thin-film transistor TR is configured as a bottom-gate-channel-etched transistor. That is, the gate electrode GE is formed on an inner surface 10A of the insulating substrate 15. The gate electrode GE of the thin-film transistor TR is formed of, for example, a metal such as copper (Cu), aluminum (Al), titanium (Ti), molybdenum (Mo), tungsten (W), tantalum (Ta) or chromium (Cr), or an alloy containing one or more of these metals. The gate electrode GE is electrically connected to the gate line G provided, for example, in the same layer as the gate electrode GE or a control line for the driver circuit. The gate electrode GE is patterned into, for example, rectangular shape.

A gate insulating layer 12 is formed to cover the gate electrode GE and the inner surface 10A of the insulating substrate 15. The gate insulating layer 12 includes a silicon oxide layer whose main constituent is silicon oxide (SiOx). In this embodiment, the gate insulating layer 12 is entirely formed of the silicon oxide layer. Note that the gate insulating layer 12 may be a multilayered film of a silicon oxide layer whose main constituent is silicon oxide (SiOx), and another insulating layer of, for example, silicon nitride (SiNx) layer. When the gate insulating layer 12 is formed of a multilayered film, it is desirable that the silicon oxide layer should be brought into contact with the semiconductor layer. Note that in this embodiment, the term "layer" is used as a concept including a layer or a film.

On the gate insulating layer 12, for example, an oxide semiconductor layer SC is formed as a semiconductor layer which forms the thin-film transistor TR. The oxide semiconductor layer SC is provided such that at least a part thereof overlaps with the gate electrode GE, and in this embodiment, the entire semiconductor layer SC superimposes on the gate electrode GE.

The oxide semiconductor layer SC is formed of an oxide containing at least one of, for example, indium (In), gallium (Ga), zinc (Zn) and tin (Sn). Typical examples of the oxide semiconductor layer SC are indium oxide gallium zinc oxide (InGaZnO), indium oxide gallium oxide (InGaO), indium oxide zinc oxide (InZnO), zinc oxide tin oxide (ZnSnO) and zinc oxide (ZnO).

The oxide semiconductor layer SC is patterned into, for example, a substantially rectangular island shape and forms a comparatively high-resistance channel region. The channel region has a channel length L. Moreover, a pixel electrode (not shown) is formed on the gate insulating layer 12 as in the case of the oxide semiconductor layer SC.

The thin-film transistor TR comprises a source electrode SE and a drain electrode DE which are brought into contact with at least a part of the oxide semiconductor layer SC. Either one of the source electrode SE and the drain electrode DE is electrically connected to a source line S formed on the gate insulating layer 12, and here it is formed in the same layer as the source line S. The source electrode SE is formed on the gate insulating layer 12, and a part of the electrode SE superimposes on the source region SCS of the oxide semiconductor layer SC.

The other one of the source electrode SE and the drain electrode DE is formed on the gate insulating layer 12, and a part thereof superimposes on the drain region SDC of the oxide semiconductor layer SC. The drain electrode DE opposes the source electrode SE while they are apart from each other by a distance equivalent to the channel length L. Further, the drain electrode DE is electrically connected to the respective pixel electrode.

The source electrode SE, the drain electrode DE and the source line S are formed of multiple metallic layers. In this embodiment, the source electrode SE, the drain electrode DE and the source line S each have a laminated structure (of Ti/Al/Ti) comprising a lower layer (first layer) 20a of a metallic material whose main constituent is Ti, such as Ti or TiN, an intermediate layer (second layer) 20b of a metallic material whose main constituent is Al, such as, AlSi, AlN or AlCu and an upper layer (third layer) 20c of a metallic material whose main constituent is Ti. The intermediate layer 20b is sufficiently thick as compared to the lower layer 20a and the upper layer 20c. The source electrode SE and the drain electrode DE are formed to be in contact with the oxide semiconductor layer SC by their lower layer 20a side surfaces, and the source line S is in contact with the gate insulating layer 12 by its lower layer 20a side surface.

As shown in FIGS. 2 and 3, the source electrode SE, the drain electrode DE and the source line S each have sidewalls, which arise against the gate insulating layer 12 and the oxide semiconductor layer SC, respectively. Each sidewall comprises a first tapered portion 22a extending to a intermediate layer 20b from an upper layer 20c and a second tapered portion 22b extending from the intermediate layer 20b to a lower layer 20a. A boundary (transition position) B between the first tapered portion 22a and the second tapered portion 22b is located in the intermediate layer 20b. Furthermore, a sidewall protective film 24 is formed on the second tapered portion 22b so as to cover the second tapered portion 22b.

The first tapered portion 22a is formed such that its taper angle θ1 (the angle of inclination with respect to a plane parallel to the inner surface 10A of the insulating substrate 15) is less than 40°, for example, 30°. The second tapered portion 22b is formed such that its taper angle θ2 is greater than the taper angle θ1, 40° or more but 70° or less, for example, 60°. The sidewall protective film 24 is formed by deposition on the second tapered portion 22b, and of a CH-based material or the like, which are produced in etching. The sidewall protective film 24 suppresses excessive side etching of the second tapered portion 22b and thus prevents the taper angle of the second tapered portion from being too small.

A passivation film (protective layer) PA is formed on the array substrate SUB1 so as to cover the source line S, the source electrode SE, the drain electrode DE and the oxide semiconductor layer SC, entirely. The passivation film PA may be formed by the chemical vapor deposition (CVD) method using an inorganic film, olefin resin, acrylic resin, siloxane resin or the like.

Note that the passivation film PA is formed to have a thickness three or more times of that of the multilayered metallic film (Ti/Al/Ti) which forms the source electrode SE, the drain electrode DE and the source line S.

Next, an example of the method of manufacturing the array substrate SUB1 applicable to the display device of this embodiment will now be described.

Figure 4:
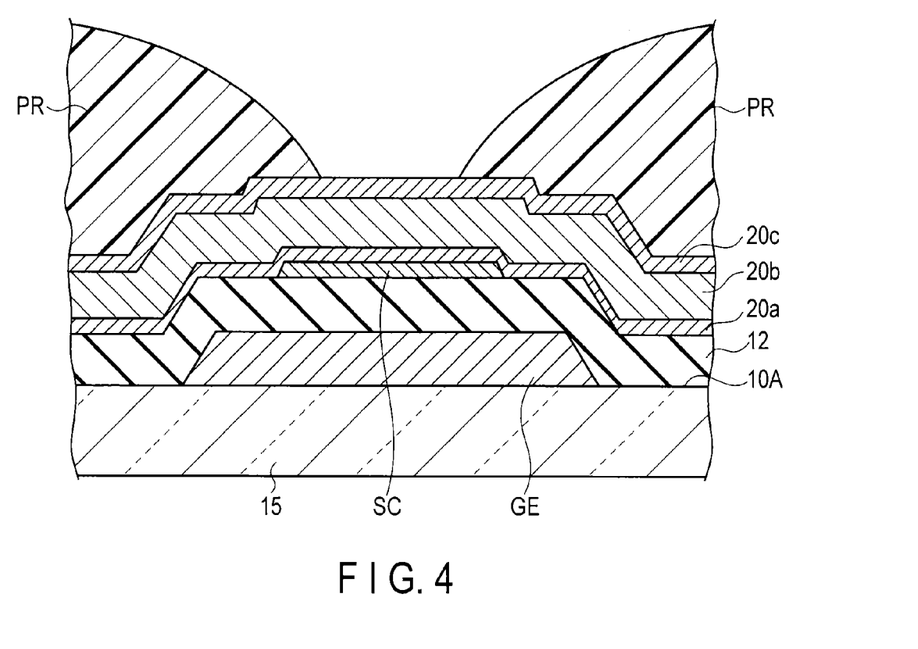
FIG. 4 is a sectional view showing a step in the process of manufacturing the array substrate.

As shown in FIG. 4, a gate layer is formed, for example, by sputtering on the inner surface 10A of the insulating substrate 15, and the gate layer is patterned into a gate line G and a gate electrode GE. Here, a transparent glass substrate is used as the insulating substrate 15, and for example a Mo-based material is used for the gate layer.

Then, a gate insulating layer 12 is formed on the inner surface 10A of the insulating substrate 15 to be overlaid on the gate electrode GE. The gate insulating layer 12 is formed, for example, by the plasma CVD method using silicon oxide (SiOx).

Next, a semiconductor layer formed of indium oxide gallium zinc oxide (InGaZnO) is formed on the gate insulating layer 12, for example, by sputtering, and then patterned into island form, thus forming two or more oxide semiconductor layers SC.

Note that, though not shown, a pixel electrode may be formed on the gate insulating layer 12 simultaneously when forming the oxide semiconductor layers SC.

Then, a metallic film is formed by sputtering or the like, to be overlaid on the gate insulating layer 12 and the oxide semiconductor layers SC. Note that the metallic film is a multilayered, comprising a Ti-based lower layer 20a, an Al-based intermediate layer 20b and a Ti-based upper layer 20c.

Subsequently, the multilayered metallic film thus formed is patterned into the source electrode SE, the drain electrode DE and the source line S. In this case, as shown in FIG. 4, a photoresist PR which has a desired pattern is formed on the multilayered metallic film. The photoresist PR is formed by, for example, applying a photosensitive insulating material such as olefin resin on the multilayered metallic film, and thereafter patterning the layer using the photolithography process accompanied by exposure and development via a photomask. The photoresist PR has a pattern located immediately above formation regions of the source electrode SE, the drain electrode DE and the source line S, and is not disposed immediately above the channel regions of the oxide semiconductor layers SC.

Figure 5:
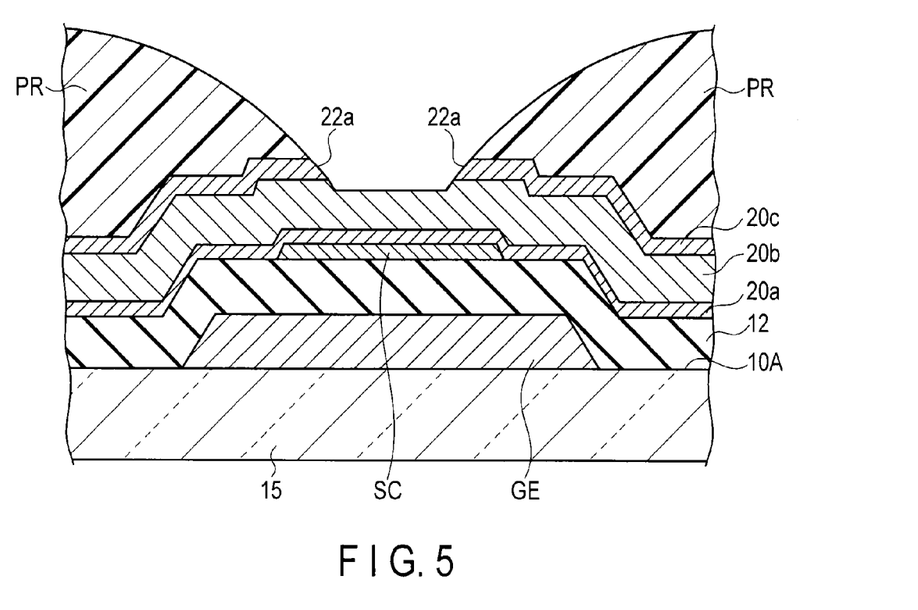
FIG. 5 is a sectional view showing a step in the process of manufacturing the array substrate.

Subsequently, the multilayered metallic film is collectively patterned by using the photoresist PR as a mask. The patterning is performed in steps of etching using, for example, reactive ion etching (RIE), which is a type of plasma dry etching. In the first stage of etching, a gaseous mixture of boron trichloride ($BCl_3$) and chlorine ($Cl_2$) is used as etching gas and the flow rate of $Cl_2$ is set at high. Here, nitrogen ($N_2$) may be further mixed. As shown in FIG. 5, in the first stage of etching, the multilayered metallic film is etched half-way through, that is, through the upper layer 20c to the middle of the intermediate layer 20b. A portion of the sidewalls formed by etching constitutes a first tapered portion having a taper angle of 45° or less.

Figure 6:
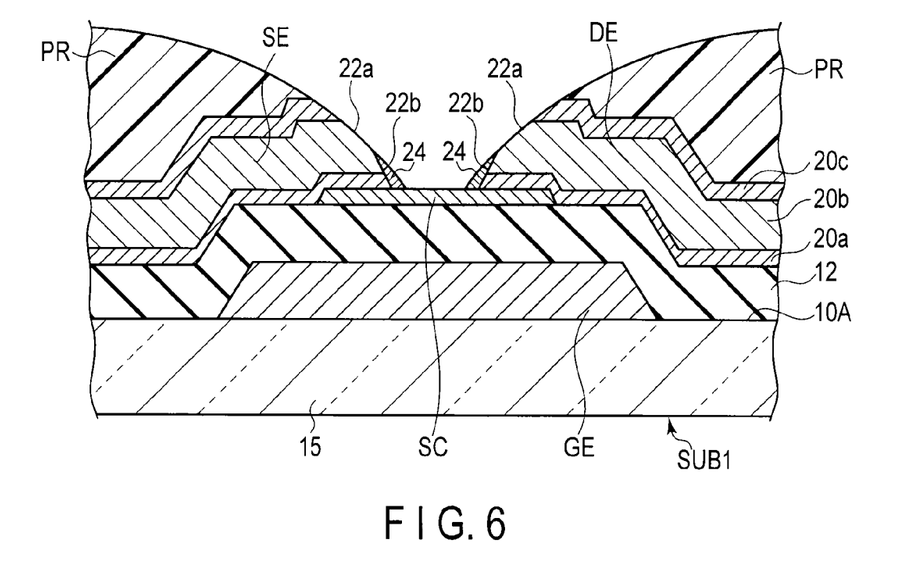
FIG. 6 is a sectional view showing a step in the process of manufacturing the array substrate.

Then, as shown in FIG. 6, the second stage of etching is continuously carried out to fully etch to the lower layer 20a of the multilayered metallic film. In the second stage of etching, a gaseous mixture obtained by mixing to boron trichloride ($BCl_3$) and chlorine ($Cl_2$) an additional gas for the formation of the sidewall protective film is used as the etching gas. As the additional gas, methane trifluoride ($CHF_3$) or the like is preferable. Further, nitrogen ($N_2$) may be added to the gaseous mixture.

By the second stage of etching, the intermediate layer 20b and the lower layer 20a are etched, and the sidewalls of the source-drain electrode and the source line are formed. During this period, the second tapered portion 22b located in the lower layer 20a side and the first tapered portion 22a located in the upper layer 20c side are formed in the respective sidewalls. The taper angle of the second tapered portion 22b is about 60°, whereas that of the first tapered portion 22a is about 30° because of the progression of etching.

During the etching process of the second stage, the additional gas ($CHF_3$) and N2 produce a CH-based material, AlFx, AlNx and the like by plasma dissociative reaction, and thus the materials so produced are deposited on the second tapered portion 22b, forming the sidewall protective film 24. With the sidewall protective film 24 thus formed, excessive side etching of the second tapered portion 22b can be suppressed, allowing the desired taper angle of the second tapered portion 22b to be maintained. Here note that the taper angle of the first tapered portion 22a is small, being approximately in the range of 30 to 45°, and therefore even if the materials are deposited thereon, they are immediately removed by etching. Thus, the sidewall protective film is not easily formed.

Figure 7:
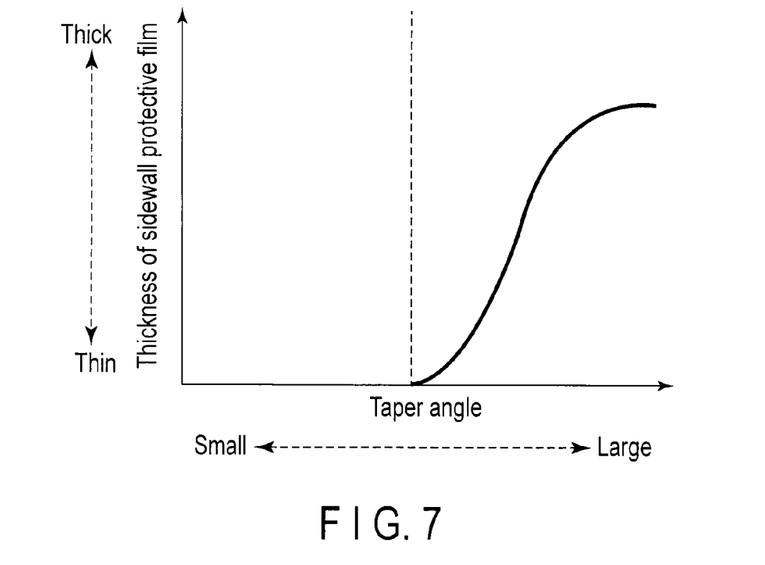
FIG. 7 is diagram schematically illustrating the relationship between the taper angle of a tapered portion and the thickness of a sidewall protective film.

FIG. 7 schematically shows the relationship between the taper angle of the tapered portion of a sidewall and the thickness of the sidewall protective film. From this figure, it can be understood that as the taper angle increases, so does the thickness of the sidewall protective film formed by deposition. In dry etching, ions are drawn by the bias of the stage, and do not easily enter the sidewall portions of the multilayered metallic film. As the taper angle is greater, fewer ions enter the sidewall portions, facilitating the formation of a sidewall protective film. Thus, the sidewall protective film 24 is formed on the second tapered portion 22b, which has a large taper angle, but hardly formed on the first tapered portion 22a, which has a small taper angle.

By the two steps of etching, the source electrode SE, the drain electrode DE and the source line S, defined by the sidewalls including the first tapered portion 22a and the second tapered portion 22b, are formed. After completion of etching, the photoresist PR is removed. Subsequently, the passivation film (protective layer) PA is formed on the array substrate SUB1 so as to cover the entire array substrate including the source line S, the source electrode SE, the drain electrode DE, the oxide semiconductor layer SC and the like. The passivation film PA is, for example, an inorganic film, olefin resin, acrylic resin or siloxane resin. It is preferable that the passivation film PA be formed to have a thickness three or more times of the thickness of the multilayered metallic film (Ti/Al/Ti) which forms the source electrode SE, the drain electrode DE and the source line S.

By the above process, the array substrate SUB1 comprising the thin-film transistors TR is manufactured.

According to the display device and the array substrate configured as above, the sidewalls of the electrodes and interconnect lines include the first tapered portion 22a on the upper layer side and the second tapered portion 22b on the lower layer side, and the taper angle of the first tapered portion is smaller than the taper angle of the second tapered portion. Further, the sidewall protective film 24 is formed on the second tapered portion.

With the sidewall protective film 24, the dispersion in the amount of side etching of the second tapered portion 22b can be reduced, and thus the electrodes and interconnect lines can be processed uniformly into a desired shape. In this manner, the mass-productivity of the array substrate can be improved. At the same time, the roughness of the sidewalls, especially, the roughness of the second tapered portion 22b can be suppressed.

Further, with the sidewall protective film 24, it is possible to extend the over-etching time. With the extension of etching time, the production of Ti residuals can be suppressed, allowing the electrodes and interconnect lines to be processed into more precise shapes.

When the transition portion (boundary) B between the first tapered portion 22a and the second tapered portion 22b is located in the Ti-based upper layer 20c in the sidewalls of the electrodes and interconnect lines, that is, when the thickness (height) of the second tapered portion 22b is large as compared to that of the first tapered portion 22a, the coverage by the passivation film PA degrades easily, and therefore voids are easily formed. On the other hand, when the taper transition portion B is located in the lower layer 20a, the thickness of the first tapered portion 22a is larger, and therefore the side etching of the first tapered portion 22a progresses greatly, which may create such a problem that the interconnect resistance is easily increased because of the CD-loss of the electrodes and interconnect lines formed from the multilayered metallic film.

According to this embodiment, the thicknesses of the first tapered portion 22a and the second tapered portion 22b are set so that the transition portion B therebetween is located in the intermediate layer 20b of the multilayered metallic film. With this structure, the above-described problem does not easily occur.

When the sidewalls stand, that is, when the taper angle is large, stepped-cut, attachment failure or the like of the passivation film PA may easily occur in the shoulder portion of the sidewalls. However, according to this embodiment, the first tapered portion 22a is formed in the upper layer side of the sidewalls so that the taper angle thereof is set less than that of the second tapered portion 22b, specifically, 45° or less, or preferably, 40° or less. Thus, the passivation film PA can be tightly attached to the interconnect lines and the electrodes, to reliably cover the entire array substrate. In this manner, the coverage of the passivation film PA can be improved. Further, the first tapered portion 22a is formed to have a moderate taper angle, as 40° or less, and therefore the sidewall protective film materials do not easily deposit on the first tapered portion. On the other hand, the second tapered portion 22b is formed to have a taper angle of 40° or more, preferably 45° or more but 70° or less, the sidewall protective wall material easy deposits (to easily remain), thereby making it possible to form the sidewall protective film in a stable manner. Note that the oxide semiconductor layers SC tend to be reduced by hydrogen (H), and therefore it is desirable that the formation of the sidewall protective films be kept to the minimum necessary.

According to this embodiment, even if the thickness of the multilayered metallic film of Ti/Al/Ti which forms the interconnect lines and the electrodes is set to one third or more the thickness of the passivation film PA, that is, if the multilayered metallic film is comparatively thick, the coverage by the passivation film PA can be maintained at high.

Therefore, with this embodiment, it is possible to provide a display device with a uniform processed shape, improved coverage, and improved mass productivity.

Next, an array substrate of a display device according to another embodiment will now be described. Note that in the following further embodiment, the same structural members as those of the first embodiment provided above will be designated by the same reference numbers, and detailed descriptions thereof will be omitted. The following descriptions are mainly focusing on the distinctive parts with respect to the first embodiment.

Second Embodiment

Figure 8:
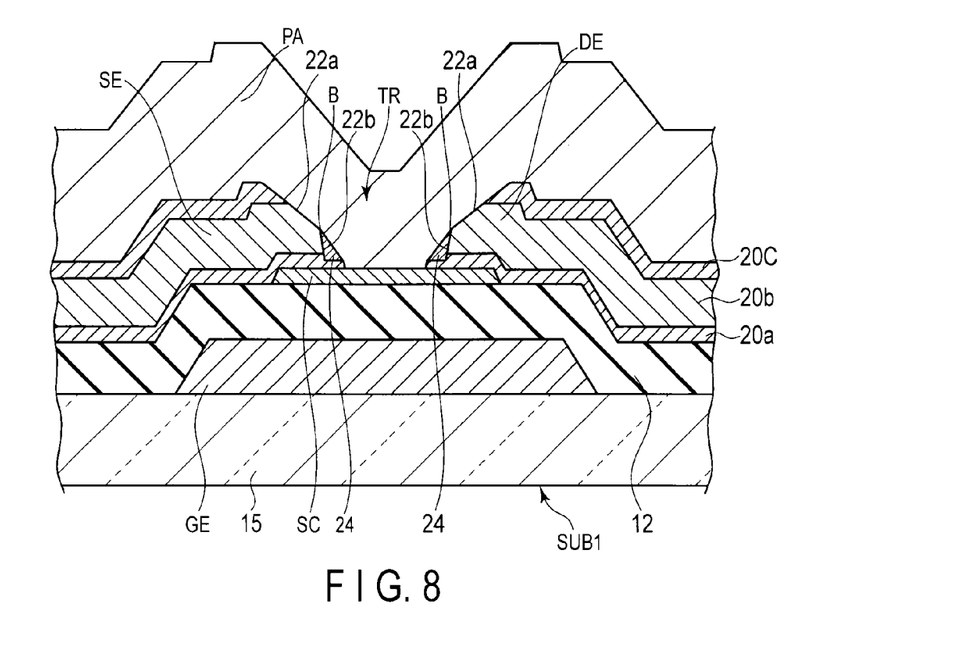
FIG. 8 is a sectional view of an array substrate in a display device according to a second embodiment.

FIG. 8 is a sectional view of an array substrate of a display device according to the second embodiment.

As shown in FIG. 8, a source electrode SE and a drain electrode DE provided on an oxide semiconductor layer SC, to form a thin-film transistor TR, and a source line S provided on a gate insulating layer 12 each comprise sidewalls. Each sidewall comprises a first tapered portion 22a extending to an intermediate layer 20b from an upper layer 20c, and a second tapered portion 22b extending from the intermediate layer 20b to a lower layer 20a. A boundary (transition position) B between the first tapered portion 22a and the second tapered portion 22b is located in the intermediate layer 20b. Further, a sidewall protective film 24 is formed on the second tapered portion 22b so as to cover the second tapered portion 22b.

In this embodiment, the sidewall protective film 24 is formed only on the sidewall of the intermediate layer 20b in the second tapered portion 22b. But the sidewall protective film 24 may be formed on an intermediate-layer 20b side end (boundary portion) of the lower layer 20a.

The first tapered portion 22a is formed such that its taper angle θ1 is less than 40°, for example, 30°. The second tapered portion 22b is formed such that its taper angle θ2 is greater than the taper angle θ1, being 40° or more but 70° or less, for example, 60°. The sidewall protective film 24 is formed by deposition on the second tapered portion 22b, and of, for example, a CH-based material or the like, which are produced in etching.

Next, an example of the method of manufacturing an array substrate SUB1 will now be described. Here, the etching process will be described.

In order to form a multilayered metallic film, which is an interconnection material, for example, a Ti-based lower layer 20a, an Al-based intermediate layer 20b and a Ti-based upper layer 20c are stacked on an insulating substrate 15, and then the multilayered metallic film thus formed is collectively patterned using a photoresist (not shown) as a mask. The patterning of the multilayered metallic film is performed in three steps of etching using, for example, a plasma dry etching method.

In the first stage of etching, a gaseous mixture of boron trichloride ($BCl_3$) and chlorine (Cl2) is used as etching gas and the flow rate of $Cl_2$ is set to be high. Here, nitrogen ($N_2$) may be further mixed. In the first stage of etching, the multilayered metallic film is etched half-way through, that is, through the upper layer 20c to the middle of the intermediate layer 20b. A portion of the sidewalls formed by etching makes a first tapered portion having a taper angle of 45° or less.

In the second stage of etching continuous to the first stage, the multilayered metallic film is further etched half-way through, that is, through the intermediate layer 20b to the boundary portion of the lower layer 20a. In the second stage of etching, a gaseous mixture obtained by mixing to boron trichloride ($BCl_3$) and chlorine ($Cl_2$) an additional gas for the formation of the sidewall protective film is used as the etching gas. As the additional gas, methane trifluoride ($CHF_3$) or the like is preferable. Further, nitrogen ($N_2$) may be added to the gaseous mixture. By the second stage of etching, the intermediate layer 20b and the boundary portion of the lower layer 20a are etched, and thus the second tapered portion 22b is formed. The taper angle of the second tapered portion 22b is about 60°, whereas the taper angle of the first tapered portion 22a is about 30° because of the progression of etching.

During the etching process of the second stage, the additional gas ($CHF_3$) and N2 produce CH-based material, AlFx, AlNx and the like by plasma dissociative reaction, and the materials thus produced are deposited on the second tapered portion 22b, forming the sidewall protective film 24. With the sidewall protective film 24 thus formed, the side etching of the second tapered portion 22b can be suppressed, enabling to maintain the second tapered portion 22b to have a desired taper angle. Here note that the taper angle of the first tapered portion 22a is as small as about 30°, and therefore even if the materials deposit thereon, they are immediately removed by etching. Thus, the sidewall protective film is not easily formed.

Next, by the third stage of etching, the rest of the lower layer 20a is etched. In the third stage of etching, addition of methane trifluoride ($CHF_3$) is stopped, and a gaseous mixture of boron trichloride ($BCl_3$) and chlorine ($Cl_2$) is used, and the flow rate of $Cl_2$ is set to be high. Here, nitrogen ($N_2$) may be further mixed. By the third stage of etching (non-sidewall protection process), the lower layer 20c is etched without producing sidewall protecting materials.

After completion of the etching, the photoresist is removed. Subsequently, the passivation film (protective layer) PA is formed on the array substrate SUB1 so as to cover the entire array substrate including the source line S, the source electrode SE, the drain electrode DE, the oxide semiconductor layer SC and the like, thereby. By the above process, the array substrate SUB1 comprising the thin-film transistors TR is manufactured.

According to the display device of the second embodiment configured as above, an advantageous effect similar to that of the first embodiment described above can be obtained. According to this embodiment, a sidewall protective film is provided on the sidewall of the Al-based intermediate layer 20b, and thus the intermediate layer, for which the side etching can more easily progress than in the Ti-based lower layer 20a, can be protected. Further, since it is not necessary to employ a sidewall protection process for etching of the lower layer 20a, that is, because methane trifluoride ($CHF_3$) is not used, the reduction of the oxide semiconductor layers SC, which is caused by hydrogen (H), can be suppressed.

Third Embodiment

Figure 9:
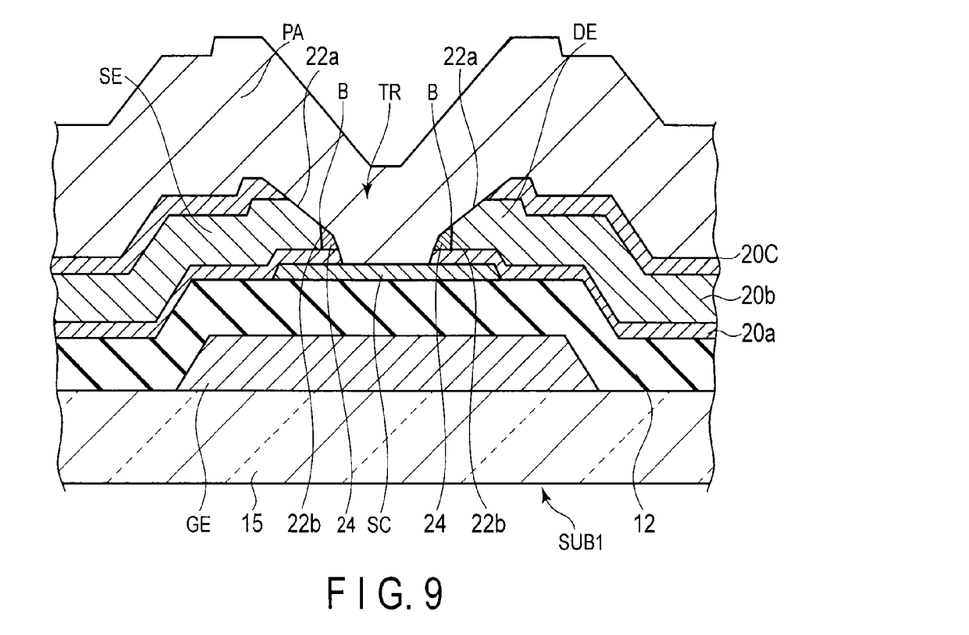
FIG. 9 is a sectional view of an array substrate in a display device according to a third embodiment.

FIG. 9 is a sectional view of an array substrate of a display device according to the third embodiment.

As shown in FIG. 9, a source electrode SE and a drain electrode DE provided on an oxide semiconductor layer SC, to form a thin-film transistor TR, and a source line S provided on a gate insulating layer 12 each comprise sidewalls. Each sidewall comprises a first tapered portion 22a extending to an intermediate layer 20b from an upper layer 20c, and a second tapered portion 22b extending from the intermediate layer 20b to a lower layer 20a. A boundary (transition position) B between the first tapered portion 22a and the second tapered portion 22b is located in the intermediate layer 20b. Further, a sidewall protective film 24 is formed on the second tapered portion 22b so as to cover the second tapered portion 22b.

According to this embodiment, in the multilayered metallic film which forms the source electrode SE, the drain electrode DE and the source line S, the lower layer 20a and the upper layer 20c are formed of a Mo-based metal such as MoCr and MoW, and the intermediate layer 20b is formed of an Al-based metal. Further, the sidewall protective film 24 is formed only on the sidewall of the intermediate layer 20b in the second tapered portion 22b.

A taper angle θ1 of the first tapered portion 22a is formed in less than 40°, for example, 30°. A taper angle θ2 of the second tapered portion 22b is formed greater than the taper angle θ1 and is set to 40° or larger but 70° or less, for example, 60°. The sidewall protective film 24 is formed by deposition on the second tapered portion 22b, and of, for example, a CH-based material and the like, which are produced in etching.

Next, an example of the method of manufacturing an array substrate SUB1 will now be described. Here, the etching process will be described.

As the multilayered metallic film, which is an interconnection material, the Mo-based lower layer 20a, the Al-based intermediate layer 20b and the Mo-based upper layer 20c are stacked on an insulating substrate 15, and then the multilayered metallic film thus formed is collectively patterned using a photoresist (not shown) as a mask. The patterning of the multilayered metallic film is performed in three steps of etching using, for example, a plasma dry etching method.

In the first stage of etching, a gaseous mixture of, for example, sulfur hexafluoride ($SF_6$) and oxygen ($O_2$) is used as etching gas to etch the upper layer 20c. In the second stage of etching, a gaseous mixture obtained by mixing to boron trichloride ($BCl_3$) and chlorine ($Cl_2$) an additional gas for the formation of the sidewall protective film is used as the etching gas, to etch the intermediate layer 20b. Here, nitrogen ($N_2$) may be added to the gaseous mixture. In this manner, the sidewalls comprising the first tapered portion 22a and second tapered portion 22b are formed.

During the etching process of the second stage, the additional gas ($CHF_3$) and N2 produce CH-based material, AlFx, AlNx and the like by plasma dissociative reaction, and the materials thus produced are deposited on the second tapered portion 22b, forming the sidewall protective film 24. With the sidewall protective film 24 thus formed, the side etching of the intermediate layer 20b, which forms the second tapered portion 22b, can be suppressed, enabling to maintain the second tapered portion 22b to have a desired taper angle. The taper angle of the second tapered portion 22b is about 60°, whereas the taper angle of the first tapered portion 22a is about 30° because of the progression of etching.

Next, by the third stage of etching, a gaseous mixture of, for example, sulfur hexafluoride ($SF_6$) and oxygen ($O_2$) is used as etching gas to etch the lower layer 20a. In this manner, the second tapered portion 22b extending from the sidewall protective film 24 to the oxide semiconductor layers SC and the gate insulating layer 12 is formed in the lower layer 20a.

According to the display device of the third embodiment configured as above, an advantageous effect similar to that of the second embodiment described above can be obtained. According to this embodiment, a sidewall protective film is provided on the sidewall of the Al-based intermediate layer 20b, and thus the intermediate layer, for which the side etching can more easily progress than in the Mo-based lower layer 20a, can be protected. Further, since it is not necessary to employ a sidewall protection process for etching of the lower layer 20a, that is, because methane trifluoride ($CHF_3$) is not used, the reduction of the oxide semiconductor layers SC, which is caused by hydrogen (H), can be suppressed.

As described above, with the second and third embodiments as well, it is possible to provide a display device with a uniform processed shape, improved coverage, and improved mass productivity.

The above-provided embodiments are described in connection with liquid display devices as their examples of display devices including thin-film transistors, but they are not limited to those described. For example, as other applicable examples, all sorts of flat-panel display devices may be listed, including organic EL display devices, luminescent display devices and electronic-paper display devices comprising electrophoretic elements. Further, the above-described structures and manufacturing processes of those embodiments can be naturally applicable not only to small- to medium-sized display devices but also to large display devices without particular limitations.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Based on the structures and manufacturing processes which have been described in the above-described embodiments and variations, a person having ordinary skill in the art may achieve structures and manufacturing processes with arbitrary design changes; however, as long as they fall within the scope and spirit of the present invention, such structures and manufacturing process are encompassed by the scope of the present invention. Further, as to other effects which may be achieved by the above-provided embodiments, those which would have been clear from the disclosure of the specification or conceivable by a person having ordinary skill in the art are considered naturally be achieved by the present invention.

What is claimed is:

1. A display device comprising:
a thin-film transistor comprising:
a gate electrode;
an insulating layer provided over the gate electrode;
a semiconductor layer over the insulating layer, at least a part of which is overlaid on the gate electrode, the semiconductor layer comprising a lower surface facing the insulating layer and an upper surface opposed to the lower surface; and
a source electrode and a drain electrode provided in contact with at least a part of the upper surface of the semiconductor layer, wherein
each of the source electrode and the drain electrode comprises a laminated structure including a lower layer located in the semiconductor layer side, an intermediate layer of aluminum as a main constituent and an upper layer, and
the source electrode and the drain electrode comprise sidewalls each comprising a first tapered portion on an upper layer side, a second tapered portion on a lower layer side, a taper angle of the first tapered portion being smaller than a taper angle of the second tapered portion, and a sidewall protective film provided on the second tapered portion in contact with the intermediate layer and formed of a CH-based material, or AlFx, and at least a part of the lower layer is positioned directly between the second tapered portion and the semiconductor layer and includes a side surface not covered by the sidewall protective film.

2. The display device of claim 1, wherein a transition portion between the first tapered portion and the second tapered portion is located in the intermediate layer.

3. The display device of claim 2, wherein the taper angle of the first tapered portion is 40° or less.

4. The display device of claim 2, wherein the taper angle of the second tapered portion is 40° or more and 70° or less.

5. The display device of claim 1, further comprising a protective layer configured to cover the source electrode, the drain electrode and the semiconductor layer,
wherein each of the source electrode and the drain electrode has a thickness of one third or more that of the protective layer.

6. The display device of claim 1, wherein the upper layer and the lower layer are formed of a Ti- or Mo-based metal.

7. The display device of claim 1, wherein the semiconductor layer is an oxide semiconductor layer of an oxide including at least one of indium (In), gallium (Ga) and zinc (Zn).

8. The display device of claim 1, wherein the taper angle of the first tapered portion is 40° or less.

9. The display device of claim 1, wherein the taper angle of the second tapered portion is 40° or more and 70° or less.

10. The display device of claim 1, further comprising a protective layer configured to cover the source electrode, the drain electrode and the semiconductor layer, wherein each of the source electrode and the drain electrode has a thickness of one third or more that of the protective layer.

11. The display device of claim 2, wherein the upper layer and the lower layer are formed of a Ti- or Mo-based metal.

12. The display device of claim 2, wherein the semiconductor layer is an oxide semiconductor layer of an oxide including at least one of indium (In), gallium (Ga) and zinc (Zn).

* * * * *